United States Patent
Zang et al.

(10) Patent No.: US 8,107,509 B2
(45) Date of Patent: Jan. 31, 2012

(54) MONOLITHIC FOLDED F-P CAVITY AND SEMICONDUCTOR LASER USING THE SAME

(75) Inventors: Erjun Zang, Beijing (CN); Jianping Cao, Beijing (CN); Ye Li, Beijing (CN); Zhanjun Fang, Beijing (CN)

(73) Assignee: National Institute of Metrology P.R. China, Beijing (CN)

( * ) Notice: Subject to any disclaimer, the term of this patent is extended or adjusted under 35 U.S.C. 154(b) by 0 days.

(21) Appl. No.: 12/865,965

(22) PCT Filed: Jan. 22, 2009

(86) PCT No.: PCT/CN2009/000093
§ 371 (c)(1),
(2), (4) Date: Oct. 28, 2010

(87) PCT Pub. No.: WO2009/097740
PCT Pub. Date: Aug. 13, 2009

(65) Prior Publication Data
US 2011/0032961 A1    Feb. 10, 2011

(30) Foreign Application Priority Data

Feb. 4, 2008 (CN) .......................... 2008 1 0004838
Feb. 28, 2008 (CN) .......................... 2008 1 0082028
Apr. 10, 2008 (CN) .......................... 2008 1 0091936
May 12, 2008 (CN) .......................... 2008 1 0097085

(51) Int. Cl.
*H01S 3/11* (2006.01)
*H01S 3/081* (2006.01)
*H01S 3/08* (2006.01)

(52) U.S. Cl. .............................. 372/93; 372/16; 372/100

(58) Field of Classification Search .................... 372/15, 372/16, 93, 100
See application file for complete search history.

(56) References Cited

U.S. PATENT DOCUMENTS

| | | | |
|---|---|---|---|
| 4,747,111 | A | 5/1988 | Trutna, Jr. et al. |
| 5,594,744 | A | 1/1997 | Lefevre et al. |
| 2002/0015427 | A1 | 2/2002 | Pilgrim et al. |
| 2003/0112838 | A1 | 6/2003 | Oh et al. |

FOREIGN PATENT DOCUMENTS

| | | |
|---|---|---|
| CN | 2344897 A | 10/1999 |
| CN | 2687911 Y | 3/2005 |
| CN | 1664647 A | 9/2005 |

OTHER PUBLICATIONS

International Search Report from P.R. China in International Application No. PCT/CN2009/000093 mailed Apr. 30, 2009.
Doringshoff, et al., "Low-noise, tunable diode laser for ultra-high resolution spectroscopy", Optics Letters, vol. 32, No. 19, pp. 2876-2878, (Oct. 1, 2007).

*Primary Examiner* — Armando Rodriguez
(74) *Attorney, Agent, or Firm* — Finnegan, Henderson, Farabow, Garrett & Dunner, L.L.P.

(57) ABSTRACT

This invention relates to a monolithic folded F-P cavity used for semiconductor laser, which is composed of a monolithic optical element. The monolithic optical element is made of the material having low propagation loss for a certain spectrum range. Light entering through an input/output coupling surface of the monolithic optical element is reflected several times between the input/output coupling surface and at least two high reflection surfaces within the monolithic optical element, and then at least one part of the light exits through the input/output coupling surface along the path which is collinear with the incident light but in an opposite direction. By means of integrating reflecting and coupling parts of the folded F-P cavity within a single monolithic optical material, this invention greatly improves the reliability of the F-P cavity, and has other advantages, such as insensitive to outside interferences, smaller size, simpler structure and easy usage. A semiconductor laser using the monolithic folded F-P cavity is also provided.

31 Claims, 5 Drawing Sheets

-Prior Art-

MONOLITHIC FOLDED F-P CAVITY AND SEMICONDUCTOR LASER USING THE SAME

CROSS REFERENCE TO RELATED APPLICATIONS

This application is a National Phase Application of International Application No. PCT/CN2009/000093, filed Jan. 22, 2009, and claims the benefit of priority of Chinese Patent App. Nos. 200810004838.2; 200810082028.9; 200810091936.4; and 200810097085.4 filed Feb. 4, 2008; Feb. 28, 2008; Apr. 10, 2008; and May 12, 2008; respectively, the contents of all of which are incorporated herein by reference in their entirety.

TECHNICAL FIELD

This invention generally relates to semiconductor laser techniques, and, specifically, to a Fabry-Perot (F-P) resonant cavity composed of a monolithic optical element, as well as a semiconductor laser using such a F-P resonant cavity.

BACKGROUND

Semiconductor lasers, including distributed feedback (DFB) semiconductor lasers and external-cavity semiconductor lasers, are important laser source used in scientific research and industry.

Conventional external-cavity semiconductor lasers are usually implemented in Littrow configuration and in Littman or grazing incidence configuration, which are shown in FIGS. 1 and 2, respectively. FIG. 1 is a schematic diagram showing the structure of an external-cavity semiconductor laser with Littrow configuration, wherein laser beams emitted from semiconductor laser diode 1 are converged into parallel beams after passing through aspheric collimator 3, and then imping onto grating 12 at an incidence angle θi. After first order diffraction thereon, the resulted diffracting light is fed back to laser diode 1 along the path collinear with the incident light and in the opposite propagation direction thereof, while the mirror-reflected light from grating 12 is transmitted as output of the laser. With such configuration, the angle θi of the incident light onto grating 12 is equal to the diffraction angle θd.

FIG. 2 is a schematic diagram showing the structure of an external-cavity semiconductor laser with Littman configuration. Likewise, the laser beams emitted from semiconductor laser diode 1 are converged by aspheric collimator 3 into parallel beams, and then imping onto grating 12 at a grazing incidence angle θi. The resulted light after the first order diffraction on grating 12 is reflected by reflector 201, and then radiates back to grating 12 as feedback along the path collinear with the incident light and in the opposite transmission direction thereof. After rediffraction on grating 12, the light returns into laser diode 1, while the mirror-reflected light on grating 12 is transmitted as output of the laser. As shown in this Figure, incidence angle θi of the light onto grating 12 is greater than the diffraction angle θd of the light from grating 12. Although having smaller power, Littman configuration allows narrower spectrum than Littrow configuration. With unmovable grating 12, the wavelength of the output laser can be modulated by adjusting the angle of reflector 201.

Usually, the external-cavity semiconductor lasers mentioned above have output spectrum linewidth of up to several hundreds KHz or even up to several MHz, and DFB semiconductor lasers provide even wider linewidth, which is undesirable for many application situations.

Now, two methods for obtaining narrow linewidth output laser are usually used. One is optical-electronic feedback method, in which a portion of the light branched from the laser beam with wide linewidth is radiated into a separate F-P cavity, laser signal reflected by or transmitted through the F-P cavity is received and fed into an electronic feedback system, which locks the laser frequency to a certain resonance peak of the F-P cavity, and thus narrows the linewidth of the laser. Another method is optical feedback method, in which a confocal F-P cavity is arranged outside the laser for producing feedback light, so as to narrow the linewidth using narrow-spectrum light feedback at resonance peak of the F-P cavity, e.g. the resonant feedback semiconductor laser proposed by B. Dahmani, L. Hollberg and R. Drullinger.

F-P cavity is an important element in optical or laser research. Folded F-P cavity, in which the reflected light in a direction opposite to the incident light at folded positions has a spectrum structure different from the straight F-P cavity, can provide optical feedback with narrow linewidth. Folded F-P cavities currently available are all composed of discrete components. For example, FIG. 3 shows a folded F-P cavity composed of discrete components, which is proposed by K. Döringshoff, I. Ernsting, R.-H. Rinkleff, S. Schiller and A. Wicht. Such a folded F-P cavity (CAV) is composed of a coupler 101 and two reflectors 102 and 103, wherein coupler 101 also serves as a folded reflector. Light from coupler 101 enters the folded F-P cavity. After reflection from reflectors 102 and 103 and coupler 101 in the cavity, two reflected beams are produced, that is, a reflected beam propagating in the same direction of and collinear with mirror-reflected light of the incident light, and an other reflected light propagating in the opposite direction of and collinear with the incident light, wherein the latter can be output from the F-P cavity as light with additional function of frequency selection.

However, due to the difficulty of accurate turning of discrete components, existing folded F-P cavities composed of discrete components are sensitive to outside inferences caused by sound, mechanical vibration and temperature influence. Further, such F-P cavity usually has a relative large volume and poor system reliability.

SUMMARY OF THE INVENTION

To solve the above-mentioned problems in existing folded F-P cavity composed of discrete components, such as unsatisfactory reliability, sensitive to outside inferences, bulky and complicated construction, a novel monolithic folded F-P cavity is provided, which is suitable for semiconductor laser and can be easily fabricated. Rather than composed of separate components, the F-P cavity according to the present invention is formed by a monolithic optical element, which is made of material having low transmission loss with respect to a certain spectrum range. Said monolithic optical element is formed in such a way that the light beam entering through an input/output coupling surface of the monolithic optical element is reflected several times between the input/output coupling surface and at least two high reflection surfaces within the monolithic optical element, and then at least a part of the light radiates out of the input/output coupling surface along a path collinear with the incident light but in an opposite direction thereto. Thus the similar function as a conventional F-P cavity composed of discrete components can be realized.

As to the laser radiation spectrum range for visible light, said monolithic optical element forming the folded F-P cavity can be made of optical material transparent to the radiation in the involved spectrum range, such as optical crystal or optical glass, in particular quartz glass.

The high reflection surfaces of said monolithic optical element preferably have a relatively high reflectivity, and the reflectivity of the input/output coupling surface can be slightly lower than the high reflection surfaces. For example, coating having reflectivity of 0.9 to 0.99 can be applied on the input/output coupling surface, and coating having absorption less than 50 ppm and reflectivity higher than 0.999 can be applied on the high reflection surfaces. The present invention, however, should in no way be limited to the illustrative coatings with above mentioned reflectivity and absorption.

According to one preferred embodiment of the invention, it is also possible for the high reflection surfaces to realize path folding by means of total reflection, without any special coating. As a result, the cost for producing the monolithic optical element can be greatly reduced. For this purpose, according to this embodiment, the monolithic optical element can be provided with one input/output coupling surface and two high reflection surfaces, wherein the input/output coupling surface which is opposite to a first high reflection surface slantingly is perpendicular to a second high reflection surface that allows total reflection, so that the light beam entering through the input/output coupling surface is perpendicularly incident to the first high reflection surface, and then is reflected back to the input/output coupling surface, a portion of which is then radiated outwards, while the other portion is reflected at the incident point and incident to the second high reflection surface. As the input/output coupling surface is perpendicular to the second high reflection surface, the light beam reflected by the second high reflection surface is again perpendicularly incident to the first high reflection surface, then returns back to the second high reflection surface after the reflection on the first high reflection surface, then comes back to the input/output coupling surface after the reflection on the second high reflection surface, and finally is partly radiated outwards at the incident position.

Preferably, the monolithic optical element is a prism with a cross-section of right trapezoidal shape, wherein the side where the right edge of right trapezoid locates forms the input/output coupling surface, the side where the hypotenuse of right trapezoid locates forms the first high reflection surface, and the side where the bottom edge locates forms the second high reflection surface capable of total internal reflection.

According to another embodiment of this invention, the monolithic optical element has one input/output coupling surface and two high reflection surfaces with the same angle with respect to the coupling surface. At least a part of the light beam entering through the input/output coupling surface is perpendicularly incident to one of the reflection surfaces, and then is reflected back to the coupling surface, where a portion of which is transmitted outwards. The other portion is reflected by the coupling surface at the incident position. The reflected portion is perpendicularly incident to another reflection surface after the reflection on the coupling surface, subsequently reflected back to the coupling surface, and then partly transmitted out of the incident position.

With the monolithic folded F-P cavity suggested in the invention, as the reflector(s) and coupler of the F-P cavity are formed by a single optical element directly, the folded F-P cavity has greatly improved reliability and has advantages such as insensitive to outside inferences, compact volume, simple construction, and easy usage, etc.

A semiconductor laser employing the monolithic folded F-P cavity as mentioned above is also provided. The semiconductor laser according to the invention comprises a semiconductor laser diode, a collimator, a grating and a folded F-P cavity, wherein the light beam emitted from the semiconductor laser diode and collimated by the collimator impinges on the grating, and after the diffraction on the grating, a diffracting light enters the folded F-P cavity, at least a part of which exits the cavity along the path which is collinear with the incident light and in an opposite direction, and, after the rediffraction on the grating, retunes back into semiconductor laser diode, wherein the folded F-P cavity is a monolithic folded F-P cavity formed by a single optical element as described above.

Alternatively, the semiconductor lasers employing monolithic folded F-P cavity can be realized with a grazing incidence Littman configuration, i.e. the incidence angle against to the grating is larger than the diffraction angle of diffracting light. Preferably, the semiconductor laser can also be provided with a "grazing diffraction on grating" configuration, i.e. the incidence angle against the grating is smaller than the diffraction angle of diffraction light against the grating. By means of such "grazing diffraction on grating" configuration suggested herein, the rotation center of F-P cavity is more easily adjustable. Further, due to the narrowed beam width of diffracting light, it is more suitable to apply monolithic folded F-P cavity with compact structure.

Alternatively, for the semiconductor laser with grating, it is also possible to insert a wave plate, such as a half wave plate, between the collimator and the grating. Through turning the wave plate, the polarization of the light incident to the grating and the F-P cavity can be varied, so as to control feedback intensity, and thereby the amount of feedback, consequently facilitating the selection of optimal feedback intensity. In such a situation, a laser light emitted from the semiconductor laser diode is collimated by the collimator and then impings on the grating through the wave plate. After grating diffraction, a light diffracted by the grating enters the monolithic folded F-P cavity, and at least a portion of which exits the monolithic folded F-P cavity along the path which is collinear with the incident light and in an opposite direction, and then after rediffraction on that grating, returns back into the semiconductor laser diode through the wave plate.

Alternatively, for the semiconductor laser with grating, it is also possible to insert a diaphragm between the grating and the folded F-P cavity for further filtering the light incident to the grating and the cavity, facilitating wavelength modulation and laser lock-in. In such a situation, the laser light emitted from the semiconductor laser diode is collimated by the collimator and then impings on the grating. After grating diffraction, the light diffracting on the grating enters the monolithic folded F-P cavity by passing through the diaphragm, then at least a portion of which exits the monolithic folded F-P cavity along the path which is collinear with the incident light and in an opposite direction, and then returns into the semiconductor laser diode after diaphragm filtering and grating diffraction once again.

Of course, it is also possible to use both of the wave plate and the diaphragm mentioned above in a semiconductor laser with grating, that is, varying the polarization of light incident to the grating and the folded F-P cavity by means of the wave plate, while filtering that light by means of the diaphragm. For this purpose, the light beam emitted from the semiconductor laser diode is collimated by the collimator and impings on the grating passing through the wave plate. After grating diffraction, the light diffracting on the grating enters the monolithic folded F-P cavity undergoing diaphragm filtering, then at least a portion of that light exits the monolithic folded F-P cavity along the path which is collinear with the incident light and in an opposite direction, and then returns back to the semiconductor laser diode after diaphragm filtering and grating diffraction once again.

Alternatively, the grating may be a reflection-diffraction grating or transmission-diffraction grating.

In an alternative embodiment of this invention, the grating may be substituted with a splitter in the semiconductor laser, wherein a light emitted from the semiconductor laser diode is collimated by the collimator and then impings on the splitter. A light divided by the splitter enters the monolithic folded F-P cavity, a portion of which exits the cavity along the path which is collinear with the incident light and in an opposite direction, and then returns back to the semiconductor laser diode through the splitter again.

Alternatively, for the semiconductor laser with a splitter, a wavelength or frequency selecting element can be inserted between the collimator and the splitter, such as interference filter, loop filter or etalon, etc. In this situation, the light beam emitted from the semiconductor laser diode is collimated by the collimator and then impings on the splitter by passing through the wavelength or frequency selecting element. A light divided by the splitter enters the monolithic folded F-P cavity, and a portion of which exits the cavity along the path which is collinear with the incident light and in an opposite direction, and then returns to the semiconductor laser diode passing through the splitter and then the wavelength or frequency selecting element again.

Alternatively, one or more of F-P cavity resonance frequency adjustment system, laser oscillation frequency adjustment or tracking system, semiconductor laser diode output frequency adjustment system also can be provided in the semiconductor laser to adjust laser output in various manners.

BRIEF DESCRIPTION OF THE DRAWINGS

The present invention will be described in detail by way of preferred embodiments with reference to accompanying drawings, wherein.

DETAILED DESCRIPTION OF PREFERRED EMBODIMENTS

Figure 4:
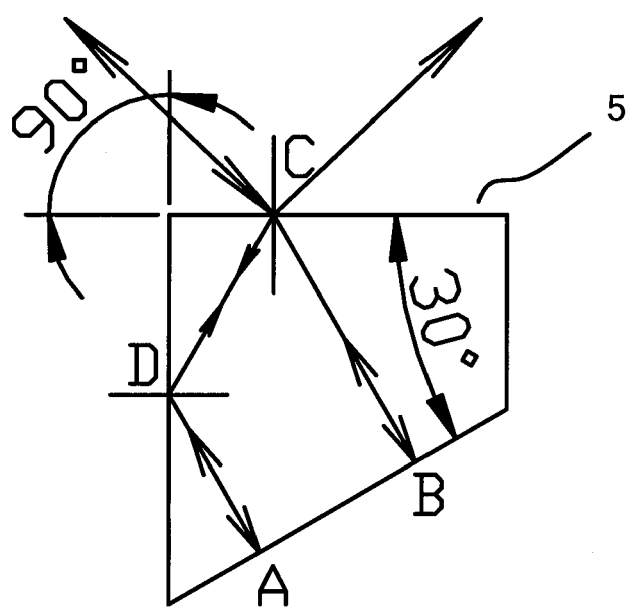
FIG. 4 schematically shows the structure of monolithic folded F-P cavity according to a first embodiment of this invention.

FIG. 4 shows the structure of monolithic folded F-P cavity 5 according to a first embodiment of this invention. According to this preferred embodiment, the monolithic optical element forming the F-P cavity is a prism with cross-section of right trapezoidal shape, which is made of monolithic material having low transmission loss for the resulted laser radiation spectrum range, such as low transmission loss quartz glass, or other optical glass (FIG. 4 shows the cross-section of the cavity, all lateral edges of the prism are vertical to that cross-section). As an example, the prism is formed in such a way that its trapezoidal cross-section has a bottom length of 15 mm and a height of 13 mm, and the length of lateral edges of the prism is 6 mm (the thickness of the monolith). Those skilled in the art will understand that the dimensions mentioned above are only illustrative, and other shapes and/or sizes are also possible for the monolithic element of the folded F-P cavity.

The side where the right edge of the right trapezoid locates forms an input/output coupling surface, on which a reflection-coating with suitable reflectivity Rc (e.g., 0.9 to 0.99) can be applied for example in an optical coating process. The side where the hypotenuse of the trapezoid locates forms a first high reflection surface, which is opposite to the input/output coupling surface slantingly, in this case, for example, at an angle of 30 degrees to the coupling surface. However, other different angles are also possible depending on the incidence angle of the light, the refractive index of the material of the monolithic element, and special design requirements. A coating with low absorption and high reflectivity, such as with absorption less than 50 ppm and with reflectivity higher than 0.999, can be applied on the first high reflection surface. The side where the bottom edge normal to the right edge of the trapezoid locates forms a second high reflection surface, which allows optical path folding by total reflection without any film for the purpose of process simplicity and cost efficiency. If the angle between the input/output coupling surface and the second high reflection surface is strictly 90°, the reflected light of dihedral corner formed by those two sides is strictly 180° reversed. Therefore, it is desired to guarantee the angular error of the angle between the two right sides (the input/output coupling surface and the second high reflection surface) and the pyramidal error of the prism during the production of the monolithic optical element, such as limiting both the right angle error and the pyramidal error within 6″. For the angles between the first reflection surface and the two right sides, such rigid angular error restriction is not necessary. The above data in production is only illustrative, and other data for less precision or reflectivity can also be conceived for the purpose of reduction of cost and treatment complexity.

In this embodiment, the input/output coupling surface and the second high reflection surface serve as folding surfaces, which cause a portion of light folded twice within the F-P cavity to exist along the path collinear with the incident light but in the opposite propagating direction, and the other portion to exist along the reflection direction of the input/output coupling surface and is combined with the reflected light. Assuming that a light of 689 nm wavelength enters the F-P cavity and is incident to point C on the input/output coupling surface at an angle of 46.7°. A portion of the light beam is reflected at point C, and the other portion enters the F-P cavity, which is then perpendicularly incident to point B on the first high reflection surface with a reflection coating after refraction, and then is reflected to point C along its original path, where both transmission and reflection occur, i.e. a portion of the light exits the F-P cavity along the path collinear with incident light but in the opposite propagating direction, and another portion after reflection on point C is incident to point D on the second high reflection surface at an incidence angle larger than total reflection angle. The light beam arriving point D is folded toward the first high reflection surface by means of total internal reflection, and then perpendicularly incident to point A, where it is reflected back to point D along the original path, and then returns to point C on the coupling surface by means of total reflection, where both transmission and reflection occur again, i.e. a portion of the light exits the F-P cavity, and another portion is reflected back to point B on the first high reflection surface from pint C. Among the light transmitted from point C, the portion which is collinear with but in opposite propagating direction of the incident light is retro-incidence reflected light that is characterized by opposite distribution with normal unfolded F-P cavity, i.e. having the highest intensity at resonance frequency and a narrower spectrum distribution; on the other hand, the portion transmitted along the mirror reflection direction of incident light is coherently overlapped with the outside mirror reflection light, resulting in a light reflected in mirror reflection direction, which has minimal intensity at resonance frequency. That is, at the resonance frequency of the F-P cavity, the light exits the F-P cavity along the path collinear with and in the opposite propagating direction of the incident light has the highest power and a narrow spectrum.

In the first embodiment, the first high reflection surface where points A and B locate forms a equivalent two-end reflector of the F-P cavity; the surface where point C locates servers not only as an input/output coupling surface of monolithic folded F-P cavity, but also as a folding surface that folds the optical paths; the second reflection surface or total reflection surface where point D locates is used as another folding surface, so as to achieve twice optical path folding within the F-P cavity. The angle between the two folding surfaces is 90°, which ensures the parallel of light incident on the folding surfaces and light reflected by the folding surfaces. All these optic functional surfaces (the coupling surface and the two high reflection surfaces) may be plane or curved surfaces (micro-convex or micro-concave surfaces).

Figure 5:
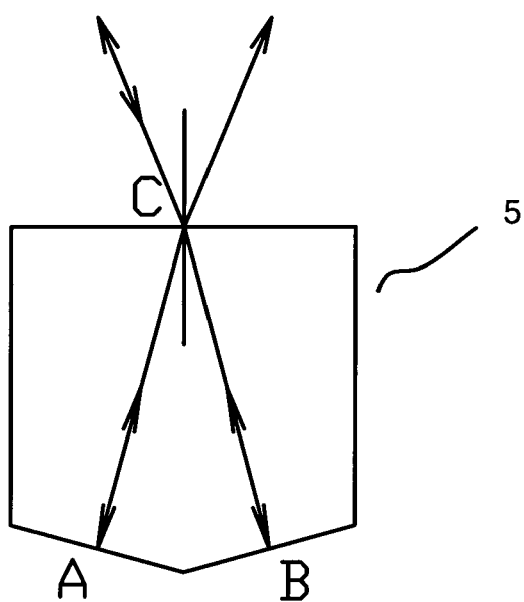
FIG. 5 schematically shows the structure of monolithic folded F-P cavity according to a second embodiment of this invention.

FIG. 5 schematically shows the structure of the monolithic folded F-P cavity according to a second embodiment of this invention. In FIG. 5, point C represents the position where a light is incident on a coupling surface, and points A and B represent the corresponding reflection positions of the two high reflection surfaces of monolithic optical element 5, wherein only one path folding occurs on the coupling surface within monolithic optical element 5.

In this case, a light beam enters monolithic optical element 5 at point C on the coupling surface, then, after refraction, is perpendicularly incident to point B on the first high reflection surface coated with high reflectivity coating, where it is reflected back to point C along the original path, and, after second reflection, folded towards the second high reflection surface coated with high reflectivity coating, and then perpendicularly incident to point A thereon, from which it returns back to point C along the original path, where both transmission and reflection occur. The optical path shown in FIG. 5 is axisymmetric, wherein the first and second high reflection surfaces have the same angle against to the coupling surface. In the second embodiment shown in FIG. 5, both high reflection surfaces that point A and point B locate respectively are coated with high reflectivity coating, and the coupling surface has a relative lower reflectivity. Therefore, the production cost of such an embodiment may be higher than that of the embodiment shown in FIG. 4.

According to the invention, temperature sensor and semiconductor cooler can be arranged to control the temperature of the monolithic folded F-P cavity. Through affixing piezoelectric transducer and temperature controlling, fast fine tuning in small range and slow coarse tuning in large range can be achieved respectively, so that the resonance frequency of the F-P cavity 5 can be well tuned and controlled.

Figure 1:
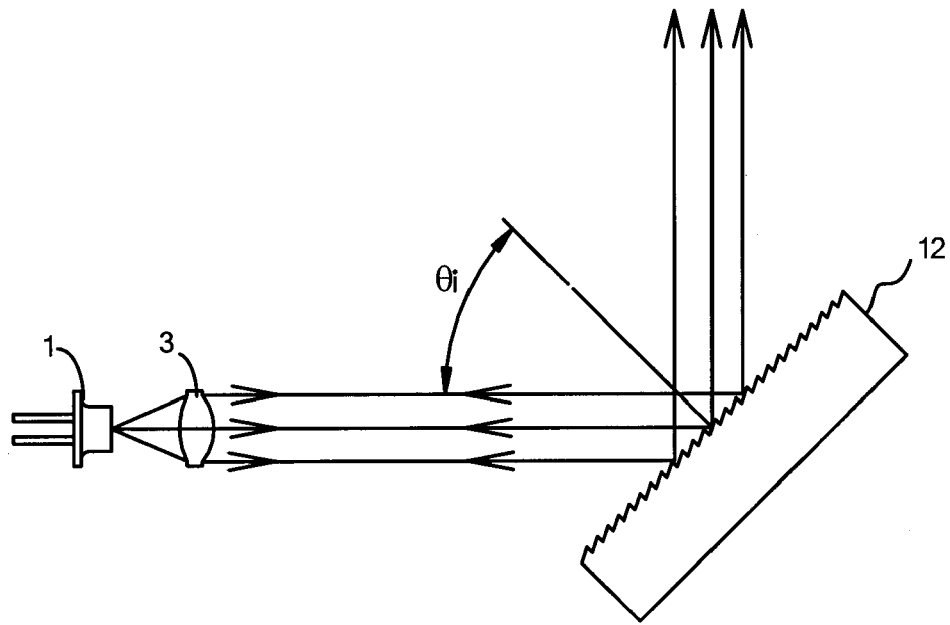
FIG. 1 is a schematic diagram showing the structure of external-cavity semiconductor laser with Littrow configuration.
Figure 2:
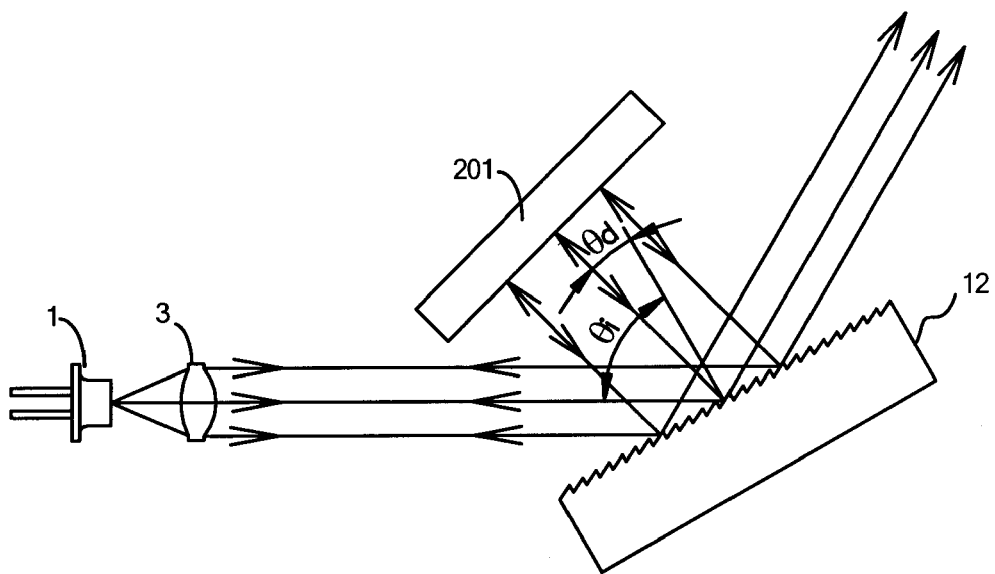
FIG. 2 is a schematic diagram showing the structure of external-cavity semiconductor laser with Littman configuration.
Figure 3:
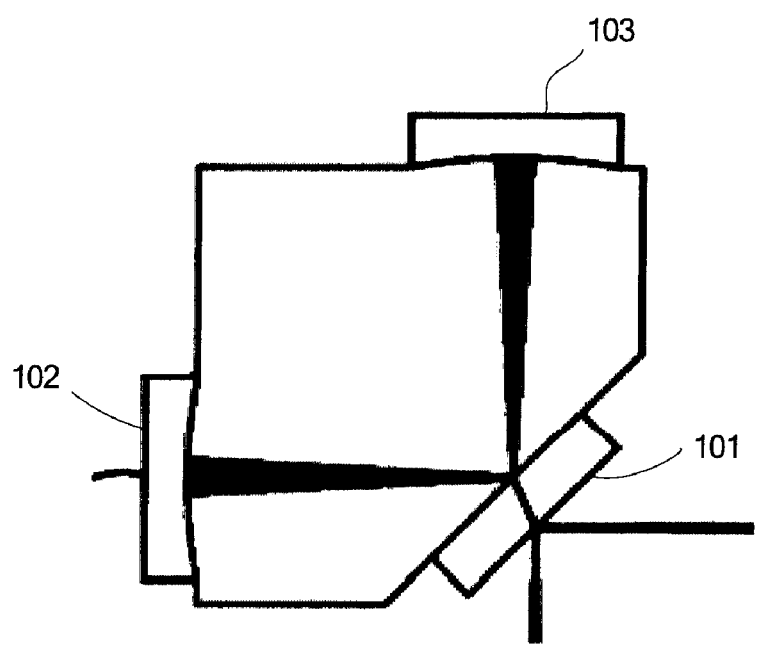
FIG. 3 schematically shows the structure of folded F-P cavity of the prior art, which is composed of discrete components.
Figure 6:
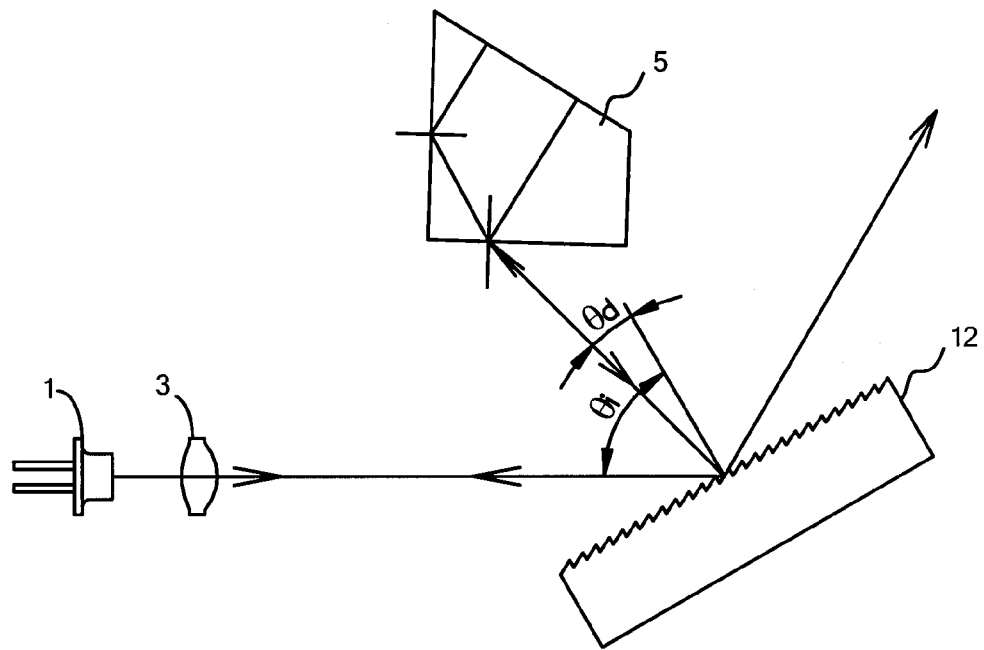
FIG. 6 is a schematic diagram of a grazing incidence Littman configuration semiconductor laser, which employing the monolithic folded F-P cavity according to the first embodiment of this invention.

FIG. 6 shows a semiconductor laser with Littman configuration, wherein the reflector of the Littman external-cavity semiconductor laser shown in FIG. 2 is substituted by the monolithic folded F-P cavity according to the first embodiment to narrow feedback linewidth.

Semiconductor laser diode 1 emits light, wherein semiconductor laser diode (LD), distributed feedback (DFB) laser or the like can be used as laser source. Semiconductor laser diode 1 for example emits light at wavelength of 689 nm and output power of 30 mW. After collimated by aspheric collimator 3 having focal length of 4 mm and numerical aperture of 0.6, the light is converged to a parallel light, which is incident to grating 12 at angle $\theta i$, where a diffraction light is obtained at diffraction angle of $\theta d$. Such a structure is referred to as "grazing incidence" structure, since the incidence angle $\theta i$ of the light incident on grating 12 from laser diode 1 is greater than the diffraction angle $\theta d$ of the diffraction light. Herein, grating 12 can be a holographic grating, such as a holographic grating having grooves density of 1800 g/mm, grooved area of 12.5 mm*12.5 mm, and thickness of 6 mm, as well as appropriate diffraction efficiency. Alternatively, grating 12 may be a blazed diffraction grating or other type of grating. Zero-order diffraction light of that grating, i.e., its mirror reflection light is used as the output of laser, and the first order diffraction light of the diffraction grating enters monolithic folded F-P cavity 5, and after several times of reflection, the retro-incidence reflection light of cavity 5 is folded back into semiconductor laser diode 1 as feedback light along the path collinear with the original incident light and in the opposite propagation direction. Since the incidence angle is greater than the diffraction angle in this Littman configuration, more grooves may participate the diffraction, resulting in better wavelength or frequency selection than traditional Littrow configuration. Similar to the first embodiment shown in FIG. 4, monolithic folded F-P cavity 5 used herein is a prism with a right trapezoidal cross-section. However, it is also possible to achieve the function of the folded F-P cavity by using the monolithic optical element of the second embodiment shown in FIG. 5, or other forms of monolithic optical element.

Alternatively, reflection grating 12 of FIG. 6 can be substituted by a transmission grating to get a semiconductor laser with transmission Littman configuration. In this case, transmission light from grating 12 is used as the output of laser.

As the Littman configuration shown in FIG. 6 has first order diffraction light that has larger size in meridian direction, an F-P cavity of larger size is required. Furthermore, for synchronous tuning of the grating and the resonance cavity, F-P cavity 5 and rotating center P of synchronous tuning are positioned on two different sides of light emitted from laser diode 1, which is adverse for the mechanical design of synchronous tuning. In order to reduce the spot size of first order diffraction light in the meridian direction and thus facilitate the mechanical design of synchronous tuning, the present invention further suggests a novel semiconductor laser structure shown in FIG. 7, which is more suitable for the monolithic folded cavity of smaller size.

Figure 7:
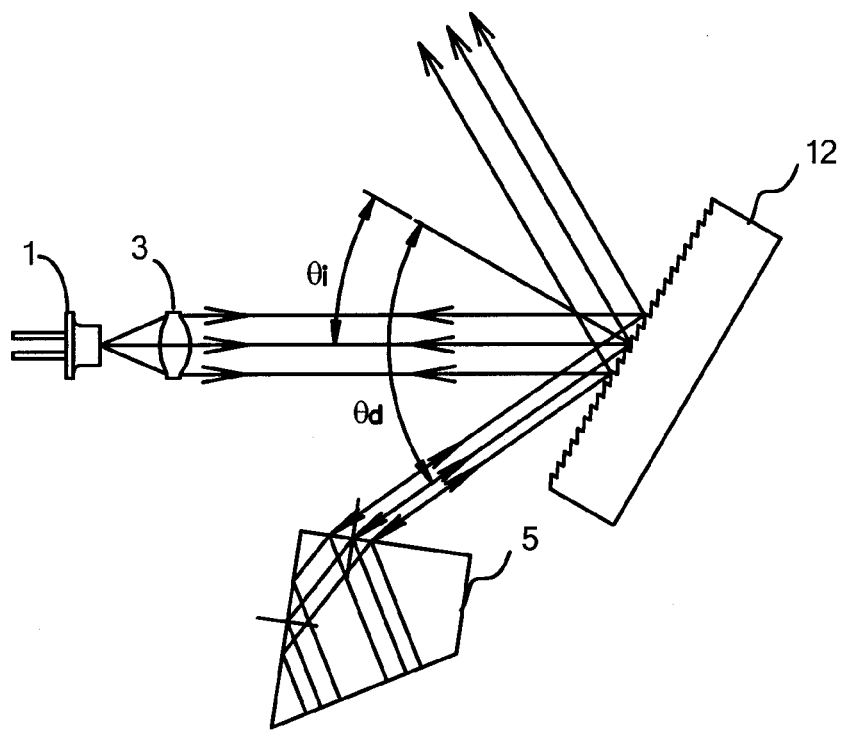
FIG. 7 is a schematic diagram of a semiconductor laser with grating-grazing diffraction construction according the this invention, which provided with the monolithic folded F-P cavity shown in FIG. 4.

The grazing diffraction by grating structure shown in FIG. 7 is considered as improvement made on basis of the Littman configuration of FIG. 6, which is also composed of semiconductor laser diode 1, collimator 3, grating 12 and monolithic folded cavity 5. With such a configuration, the light emitted from semiconductor laser diode 1 is converged to a parallel light by collimator 3, which is incident on grating 12 at angle θi, where a first order diffraction light is obtained at diffraction angle θd. The diffraction light enters monolithic folded cavity 5, and after several times of reflection within that cavity, a retro-incidence reflection light of cavity 5 returns into semiconductor laser diode 1 as feedback light along the path collinear with the incident light but in the opposite propagation direction, while the mirror reflection light of grating 12 is output. Compared with the structure shown in FIG. 6, the incidence angle θi on grating 12 of the light emitted from laser diode 1 is smaller than the diffraction angle θd of the diffraction light, for example, the light is incident to grating 12 at incidence angle θi of 21.2°, whereas the first order diffraction light on grating 12 has, for example, diffraction angle θd of 63.5°. As shown in FIG. 7, the F-P cavity and the rotating center P of synchronous tuning are located on the same side of the light emitted from laser diode 1, thus synchronous tuning can be achieved with a simplified mechanical design. Further, since diffraction spot is contracted in the meridian direction, it is possible to utilize the monolithic folded F-P cavity of smaller size to achieve compact structure of equipment.

Figure 8:
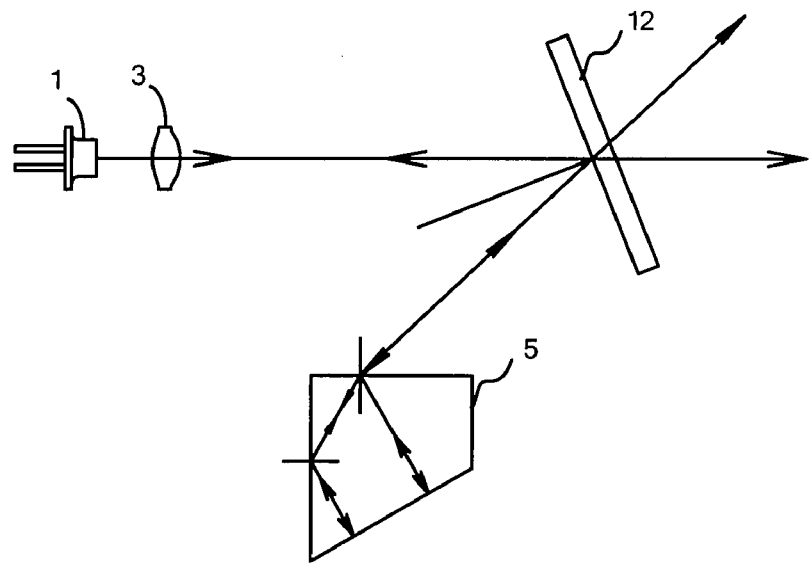
FIG. 8 is a schematic diagram of a semiconductor laser similar to that of FIG. 7, despite of the grating substituted with a splitter.

FIG. 8 shows a semiconductor laser structure similar to that of FIG. 7, except for diffraction grating 12 substituted by light splitter 12', which also has the function of frequency selection. Light emitted from laser diode 1 is collimated by collimator 3 and then impinges on splitter 12', from which a light with appropriate power is divided, which is mode matched incident on monolithic folded cavity 5. After several times of reflection of that incident light within monolithic folded cavity 5, a retro-incidence reflection light returns to semiconductor laser diode 1 as feedback light along the path collinear with the incident light but in the opposite propagation direction, while its direct transmission light is adopted as the output of laser. According to this invention, laser linewidth can be restricted as less than 100 kHz.

The output of semiconductor laser can be turned in various manners, including arranging one or more of the following adjustment systems within the semiconductor laser:

1) F-P cavity resonance frequency adjustment system, which modulates the resonance frequency determined by monolithic folded cavity 5 through varying the path length within cavity 5. In this situation, the corresponding adjustment can be implemented by changing the temperature of cavity 5 and/or the stress applied onto cavity 5; and 2) laser oscillation frequency adjustment system, which is used to adjust the oscillation frequency determined by the length of external cavity and/or the oscillation frequency determined by grating or other wavelength or frequency selection elements.

When tuning the laser oscillation frequency determined by the length of external cavity, it can be accomplished by varying the path length from grating or splitter to monolithic folded cavity 5 or by varying the path length from grating or splitter to semiconductor laser diode 1, for example, by moving monolithic folded cavity 5, grating 12 or splitter 12', and one or more elements of laser diode 1 along a certain trace, while remaining the incidence angle of the light entering cavity 5 through grating 12 or splitter 12' unchanged, or by varying the path length from grating or splitter to semiconductor laser diode 1.

Alternatively or additionally, when tuning the oscillation frequency determined by grating or other wavelength or frequency selection elements, it can be accomplished by varying the angle of grating or etalon, the resonance frequency of loop filter, or the transmitting wavelength of interference filter.

As to synchronous tuning, the two laser oscillation frequency adjustments said above can be performed concurrently and synchronously.

3) semiconductor laser diode output frequency range adjustment system, which varies the range of output frequency of semiconductor laser diode 1 by changing the input current or the temperature of semiconductor laser diode 1, for example, by changing the input current of semiconductor laser diode 1, and/or changing the temperature of semiconductor laser diode 1.

The output wavelength or frequency of semiconductor laser can be tuned by any combination of the above measures. Further, in order to obtain the best output effect, different adjustment measures can be combined during modulation to achieve peak overlapping of the obtained laser spectrum.

Figure 9:
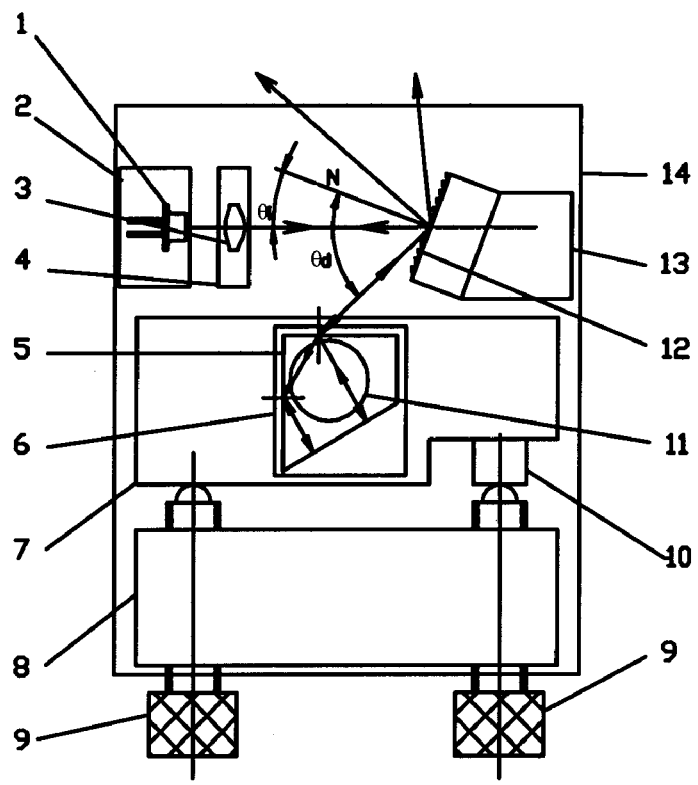
FIG. 9 is a schematic diagram showing a semiconductor laser with the adjustment systems according to this invention.

FIG. 9 schematically shows the structure of a semiconductor laser with adjustment system according to the invention, which comprises semiconductor laser diode 1, laser diode heat sink 2, aspheric collimator 3, aspheric collimator adjustable supporter 4, monolithic folded F-P cavity 5, monolithic folded F-P cavity heat sink 6 for slow and large range frequency adjustment, adjuster movable portion 7, adjuster unmovable portion 8, fine screw 9 for entirety adjustment of monolithic folded F-P cavity 5, adjuster piezoelectric transducer 10 for entirety tuning of monolithic folded F-P cavity 5, piezoelectric transducer 11 fixed on monolithic folded F-P cavity 5 for rapid frequency adjustment of folded cavity, grating 12, grating holder 13, and base plate 14. Further, FIG. 9 also shows zero-order diffraction light of grating as input light, and mirror reflection light on grating 12 of light fed back from monolithic folded F-P cavity.

The F-P cavity resonance frequency adjustment system is composed of monolithic folded F-P cavity heat sink 6 and piezoelectric transducer 11 fixed on monolithic folded F-P cavity 5; the laser oscillation frequency adjustment system is composed of the adjuster movable portion 7, adjuster unmovable portion 8, fine screw 9, and adjuster piezoelectric transducer 10, which is used to adjust the oscillation frequency determined by the length of external cavity and the laser oscillation frequency determined by grating 12; and the laser output frequency range adjustment system is composed of laser diode heat sink 2.

As the voltage applied is varied, a displacement of adjuster piezoelectric transducer 10 occurs in its thickness direction, leading to rotation of adjuster movable portion 7, in turn, rotating monolithic folded F-P cavity 5, and thus changing the direction of first order diffraction light returned to grating 12, as well as the path length, finally accomplishing the adjustment of output laser frequency. Although adjuster piezoelectric transducer 10 is used in this embodiment, those skilled in the art will appreciate that it is also possible to arrange two or more adjuster piezoelectric transducers at different positions of adjuster movable portion 7 for controlling the movement of adjuster movable portion 7.

In this example, piezoelectric transducer 11 fixed on monolithic folded F-P cavity 5 is in sheet form, which also can be configured as circle, rectangle, or any other polygon. As the voltage applied on piezoelectric transducer 11 varied, the area of piezoelectric transducer 11 changes correspondingly, resulting in the change of the shape of monolithic folded F-P cavity 5, and thus changing the resonance frequency of the F-P cavity, finally accomplishing the adjustment of output laser frequency. As compared with the adjustment of adjuster piezoelectric transducer 10, piezoelectric transducer 11 can perform frequency tuning more carefully or accurately.

Laser diode heat sink 2 is used to control semiconductor laser diode 1 temperature, and monolithic folded F-P cavity heat sink 6 is used to control the temperature of monolithic folded F-P cavity 5, so as to control its resonance frequency through temperature variance, finally adjusting laser output frequency. Although slower than the control of piezoelectric transducer 11, it has a wider tunable range.

Certainly, the resonance frequency adjustment system mentioned above can only be provided with one of monolithic folded F-P cavity heat sink 6 and piezoelectric transducer 11 fixed on monolithic folded F-P cavity 5, and other methods are also possible to adjust the optical path length to monolithic folded F-P cavity 5.

The laser oscillation frequency adjustment system can be configured such that monolithic folded F-P cavity 5 is unmovable, and grating holder 13 is rotational, for example, arranging an unmovable portion, a fine tuning screw mounted on the unmovable portion, and a piezoelectric transducer adhered to the grating holder. As such, grating holder 13 can be rotated to change the orientation of grating 12 by means of the fine tuning screw or varying the voltage applied to the piezoelectric transducer, changing the direction of incidence light and diffraction light on grating 12, as well as the length of the external cavity, so as to achieve the purpose of frequency tracing and synchronous tuning of output laser. It is also possible to provide the laser oscillation frequency adjustment system with only one of the fine tuning screw and the piezoelectric transducer, or to change the diffraction angle of light incident to monolithic folded F-P cavity 5 in other manners. Also, another laser oscillation frequency adjustment system can be utilized, which moves either or both of monolithic folded F-P cavity 5 and grating 12 simultaneously, to change the distance from grating 12 to cavity 5.

Optionally, the current input of semiconductor laser diode 1 also can be controlled to change the output frequency range of the semiconductor laser diode.

The structure shown in FIG. 9 is only illustrative, and it will be obviously to combine those tuning manners into the semiconductor laser with splitter shown in FIG. 8.

In various embodiments mentioned above, the monolithic folded F-P cavity may also take other forms different to that shown in FIG. 4, so long as meeting requirements of resonant cavity. The monolithic folded F-P cavity is made by high quality optical glass with ultra purity and uniformity, fewer bubbles and low absorption, optical quartz glass, or other optical materials transparent to radiation in corresponding spectrum ranges, which have extremely low transmission loss, and allow the three reflection surfaces of which to be processed as micro-convex surfaces to guarantee the reliability of resonant cavity. The reflection area on each optical surface is finely processed according to surpersmooth optical process, preferably resulting in a roughness less than 0.5 nm, in some situations, however, larger than 0.5 nm.

Other materials also can be utilized to form monolithic folded F-P cavity, and the reflection surfaces may be plane surface, micro-convex surface, micro-concave surface and any combination thereof. Fox example, one or more reflection surfaces can be constructed as micro-convex surface as needed to correct scattered beams; or one or more of them can be constructed as micro-concave surface to correct converged beams.

Those skilled in the art should understand that many modifications can be made to those embodiments illustrated above without departing the sprite of this invention.

What is claimed is:

1. A monolithic optical element for a monolithic folded F-P cavity, comprising:
    at least one input/output coupling surface; and
    at least two reflection surfaces;
    wherein the monolithic optical element is formed so that:
        at least a portion of incident light entering the monolithic optical element through the input/output coupling surface is reflected several times between the input/output coupling surface and the at least two reflection surfaces, and
        an output light radiates out from the input/output coupling surface along a path collinear with and in an opposite propagation direction of the incident light.

2. The monolithic optical element according to claim 1, wherein the input/output coupling surface and the reflection surfaces have a roughness less than 0.5 nm.

3. The monolithic optical element according to claim 1, wherein the input/output coupling surface has applied thereto a coating having a reflectivity of 0.9 to 0.99.

4. The monolithic optical element according to claim 1, wherein the reflection surfaces comprise a coating having an absorption less than 50 ppm and a reflectivity larger than 0.999.

5. The monolithic optical element according to claim 1, wherein the input/output coupling surface is opposite to a first one of the reflection surfaces slantingly, and is perpendicular to a second one of the reflection surfaces that allows total reflection, so that:
    the at least a portion of the incident light entering through the input/output coupling surface at an incident position is perpendicularly incident on the first reflection surface, and reflected back to the input/output coupling surface,
    a portion of the light is then coupled out at the incident position, and
    the other portion is reflected and incident on the second reflection surface, and is reflected by the second reflection surface and perpendicularly incident on the first reflection surface, which, after being reflected by the first reflection surface, returns to the second reflection surface, then, after being reflected by the second reflection surface, returns to the input/output coupling surface, and partly radiates outwards at the incident position.

6. The monolithic optical element according to claim 5, wherein:
    the monolithic optical element is a prism with a cross-section of a right trapezoid,
    a right edge of the right trapezoid forms the input/output coupling surface,
    a hypotenuse of the right trapezoid forms the first reflection surface, and
    a bottom edge of the right trapezoid forms the second reflection surface.

7. The monolithic optical element according to claim 5, wherein the second reflection surface is not coated.

8. The monolithic optical element according to claim 1, wherein:
    at least a portion of the light entering through the input/output coupling surface at an incident position is perpendicularly incident on one of the reflection surfaces, and then is reflected back to the input/output coupling surface, a portion of the light reflected back to the input/output coupling surface is coupled out, and the other portion of the light is reflected by the input/output coupling surface at the incident position, perpendicularly incident on the other reflection surface, reflected back to the input/output coupling surface, and partly radiates outwards at the incident position.

9. The monolithic optical element according to claim 1, wherein each of the input/output coupling surface and the reflection surfaces is one of a plane surface, a micro-convex surface, or a micro-concave surface.

10. The monolithic optical element according to claim 6, wherein both a right angular error of the right trapezoid and a pyramidal error of the prism are limited within 6".

11. A semiconductor laser, comprising:
a semiconductor laser diode;
a collimator;
a grating; and
a folded F-P cavity,
wherein:
light emitted from the semiconductor laser diode is collimated by the collimator and impinges on the grating,
at least a portion of a diffraction light diffracted from the grating enters the folded F-P cavity,
at least a portion of the diffracted light exits the folded F-P cavity along a path which is collinear with incident light and in an opposite direction, and then
after being diffracted again on the grating, returns into the semiconductor laser diode, and
wherein the folded F-P cavity is a monolithic folded F-P cavity formed by a monolithic optical element according to claim 1.

12. The semiconductor laser according to claim 11, wherein an incidence angle θi at which the light emitted from the semiconductor laser diode is incident on the grating is larger than a diffraction angle of the diffraction light.

13. The semiconductor laser according to claim 11, wherein an incidence angle θi at which the light emitted from the semiconductor laser diode is incident on the grating is smaller than a diffraction angle of the diffraction light.

14. The semiconductor laser according to claim 11, wherein the grating is one of a reflection diffraction grating and a transmission diffraction grating.

15. The semiconductor laser according to claim 14, wherein the grating is a blazed diffraction grating or a holographic grating.

16. The semiconductor laser according to claim 11, further comprising a wave plate inserted in an optical path between the collimator and the grating, the wave plate being a half wave plate.

17. The semiconductor laser according to claim 11, further comprising a diaphragm inserted in an optical path between the collimator and the grating.

18. The semiconductor laser according to claim 11, wherein:
the grating is substituted by a splitter,
light emitted from the semiconductor laser diode that is collimated by the collimator impinges on the splitter and is divided into at least two light beams by the splitter,
at least a portion of one of the at least two light beams enters the monolithic folded F-P cavity, and
a portion of the entering light beam exits the cavity along a path which is collinear with the one of the at least two light beams and has an opposite direction, and, after passing through the splitter, returns to the semiconductor laser diode.

19. The semiconductor laser according to claim 18, further comprising a wavelength selecting element inserted in an optical path between the collimator and the splitter, the wavelength selecting element being one of an interference filter, a loop filter, or an etalon.

20. The semiconductor laser according to claim 11, further comprising an F-P cavity resonance frequency adjustment system, which is used to modulate a resonance frequency determined by the F-P cavity by varying a path length of the folded F-P cavity.

21. The semiconductor laser according to claim 20, wherein the F-P cavity resonance frequency adjustment system varies the path length of the folded F-P cavity by changing at least one of the temperature of and the stress applied onto the monolithic optical element of the folded F-P cavity.

22. The semiconductor laser according to claim 21, wherein the F-P cavity resonance frequency adjustment system comprises an F-P cavity heat sink, which is used to control the temperature of the monolithic optical element of the folded F-P cavity, so as to control the resonance frequency of the F-P cavity.

23. The semiconductor laser according to claim 21, wherein the F-P cavity resonance frequency adjustment system comprises a piezoelectric transducer fixed on the monolithic optical element, and
wherein the resonance frequency of the F-P cavity is controlled by changing a voltage supplied to the piezoelectric transducer, so as to control a stress applied on the monolithic optical element.

24. The semiconductor laser according to claim 11, further comprising a laser oscillation frequency adjustment system, which is used to adjust laser oscillation frequency determined by at least one of an external cavity length and a laser oscillation frequency determined by the grating.

25. The semiconductor laser according to claim 19, further comprising a laser oscillation frequency adjustment system, which is used to adjust laser oscillation frequency determined by the selecting element.

26. The semiconductor laser according to claim 11, further comprising a semiconductor laser diode output frequency range adjustment system, which is used to vary a range of output frequency of the semiconductor laser diode by changing at least one of an input current and a temperature of the semiconductor laser diode.

27. The monolithic optical element according to claim 1, wherein the monolithic optical element is made of a material having low transmission loss.

28. The monolithic optical element according to claim 27, wherein the material is optical crystal or optical glass.

29. The monolithic optical element according to claim 1, wherein the monolithic optical element is made of a material having low transmission loss with respect to a spectrum range encompassing the frequency of the incident light.

30. The monolithic optical element according to claim 28, wherein the material is quartz glass.

31. The monolithic optical element according to claim 8, wherein the two reflection surfaces have the same angle with respect to the input/output coupling surface.

* * * * *